(12) United States Patent
Zweifel et al.

(10) Patent No.: US 9,287,032 B1
(45) Date of Patent: Mar. 15, 2016

(54) SINGLE PIECE FRAME FOR TRANSFORMER CORE/COIL ASSEMBLY

(71) Applicant: ABB Technology AG, Zurich (CH)

(72) Inventors: Bryan Zweifel, Linn, MO (US); Dana L. Basel, Jefferson City, MO (US); Santiago I. Serrano, Jefferson City, MO (US)

(73) Assignee: ABB Technology AG, Zurich (CH)

( * ) Notice: Subject to any disclaimer, the term of this patent is extended or adjusted under 35 U.S.C. 154(b) by 0 days.

(21) Appl. No.: 14/489,566

(22) Filed: Sep. 18, 2014

(51) Int. Cl.
| | |
|---|---|
| H01F 27/02 | (2006.01) |
| H01F 27/06 | (2006.01) |
| H02G 3/08 | (2006.01) |
| H02G 3/14 | (2006.01) |
| H02G 3/10 | (2006.01) |
| H05K 5/04 | (2006.01) |
| H01F 41/02 | (2006.01) |

(52) U.S. Cl.
CPC ............... *H01F 27/06* (2013.01); *H01F 27/02* (2013.01); *H01F 41/02* (2013.01); *H02G 3/086* (2013.01); *H02G 3/10* (2013.01); *H02G 3/14* (2013.01); *H05K 5/04* (2013.01)

(58) Field of Classification Search
CPC ........ H01F 27/025; H01F 27/02; H01F 27/04
See application file for complete search history.

(56) References Cited

U.S. PATENT DOCUMENTS

| | | | |
|---|---|---|---|
| 1,731,894 A | 10/1929 | Frisch | |
| 1,974,588 A * | 9/1934 | Snell | ............................... 336/96 |
| 2,148,449 A * | 2/1939 | Edwards | ......................... 336/67 |
| 2,372,067 A * | 3/1945 | Forbes | ........................... 336/210 |
| 2,916,713 A | 12/1959 | Lionel | |
| 5,092,027 A | 3/1992 | Denner | |
| 7,095,626 B2 * | 8/2006 | Seidler | ................ H05K 9/0026 174/51 |

FOREIGN PATENT DOCUMENTS

GB          1468303          3/1977

OTHER PUBLICATIONS

International Search Report & Written Opinion in PCT/US2015/049887 dated Jan. 8, 2016.

\* cited by examiner

*Primary Examiner* — Hung V Ngo
(74) *Attorney, Agent, or Firm* — Manelli Selter PLLC; Edward J. Stemberger

(57) ABSTRACT

A one-piece frame is provided for a core/coil assembly of a transformer. The frame includes a first wall, a second wall integral with the first wall, a third wall integral with the second wall and in opposing relation to the first wall, and a fourth wall integral with the third wall and in opposing relation to the second wall. Mounting structure secures the fourth wall to the first wall. The walls define a generally rectangular enclosure having open sides communicating with an interior space. The interior space is constructed and arranged to house at least a portion of a core/coil assembly of a transformer.

9 Claims, 3 Drawing Sheets

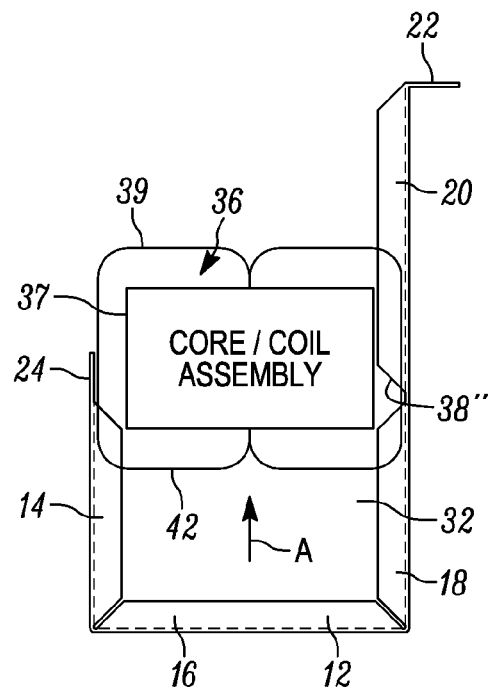
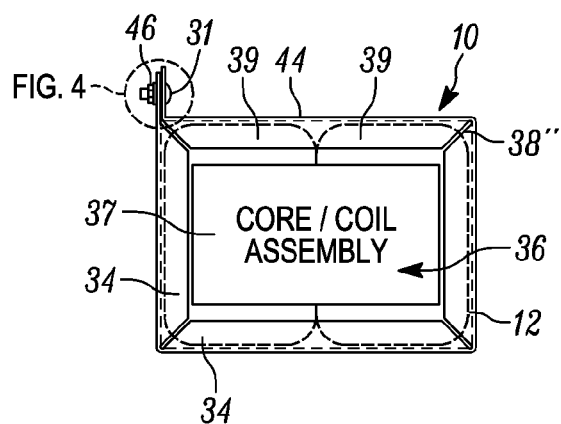
FIG. 3D
FIG. 3E
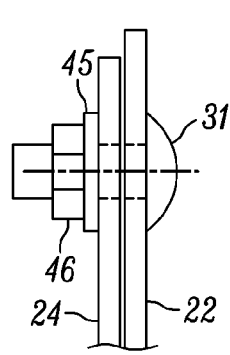
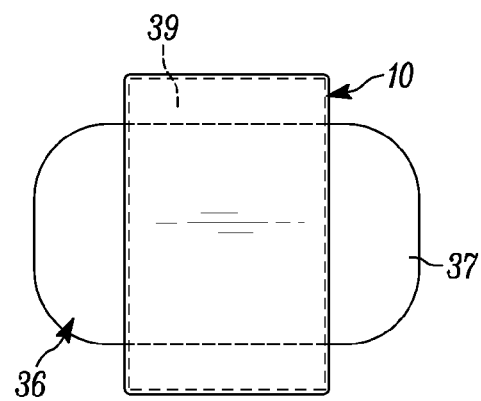
FIG. 4
FIG. 5

SINGLE PIECE FRAME FOR TRANSFORMER CORE/COIL ASSEMBLY

FIELD

The invention relates to a core/coil assembly for a single phase distribution transformer and, more particularly, to single piece frame that surrounds the core/coil assembly for mounting into a tank of the transformer.

BACKGROUND

A conventional core/coil assembly for a single phase, oil-filled distribution transformer includes a frame assembly having a U-shaped channel that is used in conjunction with two, separate metal angles (top frames). Four sets of bolted hardware are used to complete the mounting of the U-shaped channel to the top frames. In addition, to secure this frame assembly and thus the core/coil assembly into a transformer tank, a unique angular bracket is incorporated to connect the top frames to a welded channel located on a vertical wall of the tank. Three additional sets of bolted hardware are used for this tank mounting. These additional parts and the associated assembly time increase the cost of the transformer.

A second method of securing a conventional core/coil assembly incorporates a top and bottom channel and requires the use of a banding strap to secure the assembly together. With this assembly, there are issues with obtaining the correct banding tension. Also, safety issues may arise when lifting the assembly supported by the bands, due to the structural integrity of the assembly.

Thus, there is a need to provide a single piece frame for a core/coil assembly of distribution transformer that eliminates the multiple frame parts, bolts, or banding straps of the conventional frame assemblies.

SUMMARY

An object of the invention is to fulfill the need referred to above. In accordance with the principles of an embodiment, this objective is obtained by a one-piece frame for a core/coil assembly of a transformer. The frame includes a first wall, a second wall integral with the first wall, a third wall integral with the second wall and in opposing relation to the first wall, and a fourth wall integral with the third wall and in opposing relation to the second wall. Mounting structure secures the fourth wall to the first wall. The walls define a generally rectangular enclosure having open sides communicating with an interior space. The interior space is constructed and arranged to house at least a portion of a core/coil assembly of a transformer.

In accordance with another aspect of the disclosed embodiment, a method provides a frame and a core/coil assembly for a transformer. The method provides a linear, single piece of metal as a frame having first, second, and third notches disposed in spaced relation. The frame has opposing ends. A first portion of the frame is bent about the first notch to define a first wall of the frame. A second portion of the frame is bent about the second notch to define a second wall and a third wall of the frame and to define an opened end communicating with an interior space of the frame. The frame or the core/coil assembly is moved so that the core/coil assembly is engaged by a surface of the second wall, with the core/coil assembly being disposed in the interior space. A third portion of the frame is bent about the third notch to define a fourth wall of the frame and to close the opened end, thereby defining a generally rectangular enclosure about a portion of the core/coil assembly having open sides, with the opposing ends of the frame being adjacent to each other.

Other objects, features and characteristics of the present invention, as well as the methods of operation and the functions of the related elements of the structure, the combination of parts and economics of manufacture will become more apparent upon consideration of the following detailed description and appended claims with reference to the accompanying drawings, all of which form a part of this specification.

BRIEF DESCRIPTION OF THE DRAWINGS

The invention will be better understood from the following detailed description of the preferred embodiments thereof, taken in conjunction with the accompanying drawings, wherein like reference numerals refer to like parts, in which:

FIGS. 3A-3E show assembly step of bending the frame securing the core/coil assembly therein, in accordance with an embodiment.

FIG. 4 is an enlarged view of the portion encircled at 4 in FIG. 3E.

FIG. 5 is a top view of the frame and core/coil assembly of FIG. 3E.

DETAILED DESCRIPTION OF AN EXEMPLARY EMBODIMENT

Figure 1:
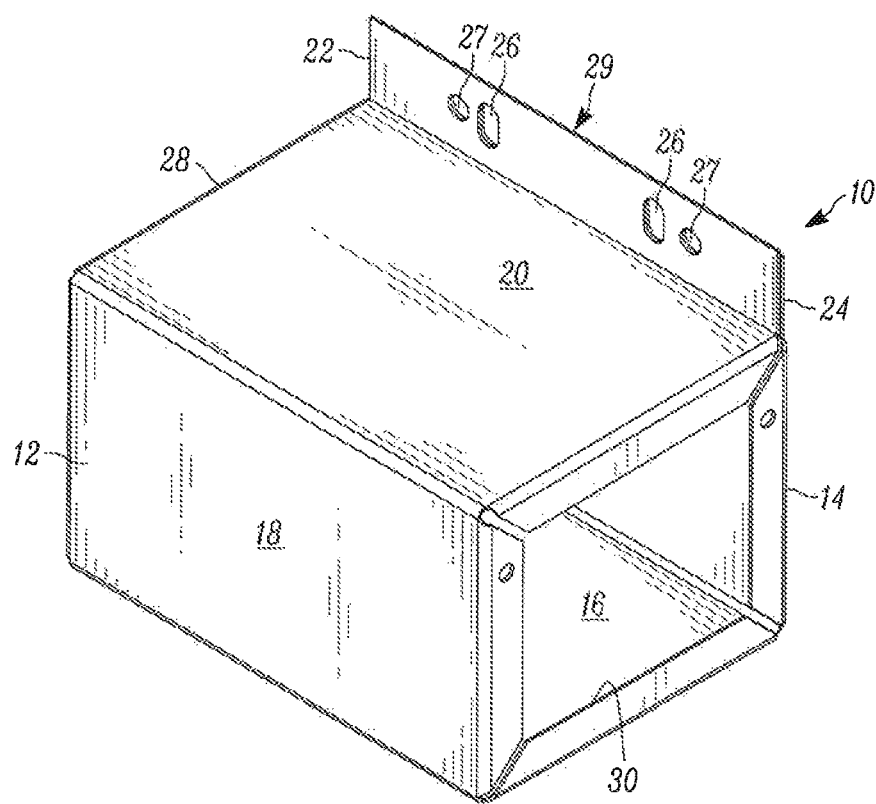
FIG. 1 is a perspective view of a single piece core frame for a single phase distribution transformer provided in accordance with an embodiment.
Figure 2:
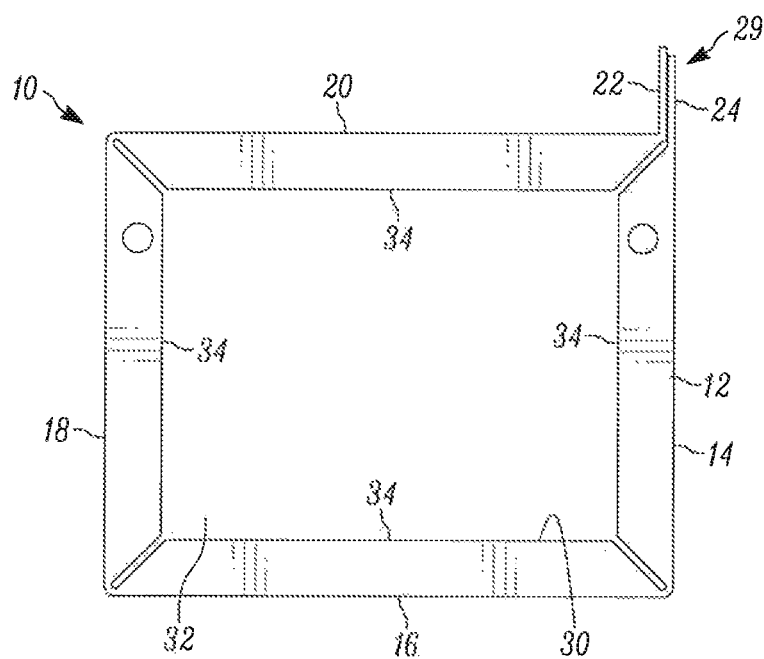
FIG. 2 is a side view of the frame of FIG. 1.

With reference to FIGS. 1 and 2, a single piece frame for a core/coil assembly of a distribution transformer is shown, generally indicated at 10, in accordance with an embodiment. The frame 10 is formed from a single (unitary) piece of steel or metal 12. Thus, the frame 10 is bent to define a first or back wall 14, a second or bottom wall 16 integral with the back wall 14, a third or front wall 18 integral with the bottom wall 16 and in opposing relation to the back wall 14, and a fourth or top wall 20 integral with the front wall and in opposing relation to the bottom wall 16. Ends of the top wall 20 and back wall 14 include mounting flanges 22, 24, respectively, which include through-holes 26, 27. The mounting flange 22 is disposed transversely with respect to the top wall 20 so as to align with the mounting flange 24 that extends from the back wall 14. Thus, the mounting flanges 22 and 24 are in mating relation so that the through-holes 26 and 27 align to define mounting structure, generally indicted at 29. Fasteners 31 (FIG. 3E), such as carriage bolts, are provided through the holes 27 for securing the mounting flanges 22 and 24 together as will be explained below. Holes 26 can be used to mount the frame 10 to a wall of a transformer tank (not shown).

As shown in FIG. 1, the frame 10 forms a generally rectangular enclosure having opposing open sides 28, 30 that communicate with an interior space 32. At the opposing sides 28 and 30, each side of each wall 14, 16, 18 and 20 includes a side flange 34 that is bent inwardly to extend transversely with respect to the associated wall.

Figure 3A:
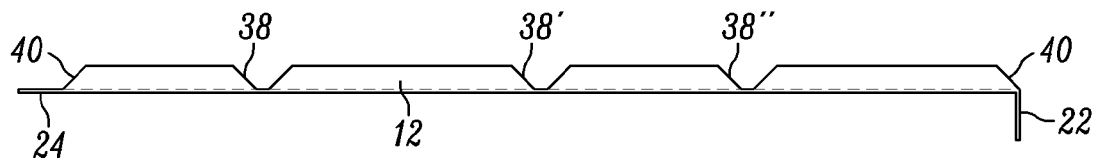
Figure 3B:
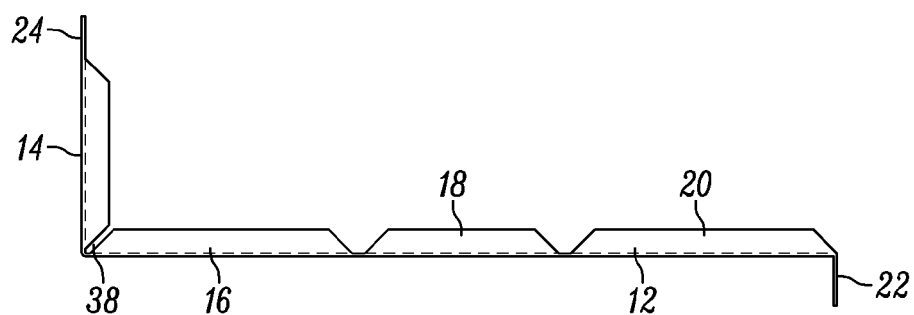
Figure 3C:
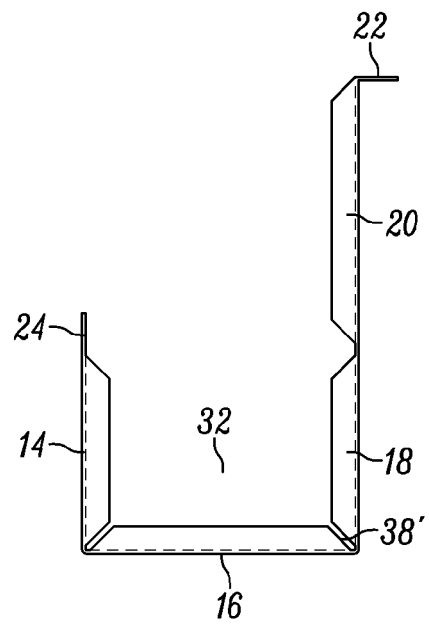

With reference to FIGS. 3A-3E, a method of providing the frame 10 to house the core/coil assembly, generally indicated at 36, will be appreciated. The core/coil assembly 36 has at least one coil 37 wound about a ferromagnetic metal core 39 in the conventional manner. First, as shown in FIG. 3A, the linear, unitary piece of metal 12 (e.g., steel) is provided with notches 38, 38' and 38" disposed in spaced relation. The piece of metal 12 also has opposing, mating ends with mating angled portions 40, 40' and mating mounting flanges 24 and 22. With reference to FIG. 3B, the first or back wall 14 is bent about the notch 38. Next, as shown in FIG. 3C, a second portion of the piece of metal 12 is bent about notch 38', thereby forming the second or bottom wall 16 and the third or front wall 18, with the fourth or top wall 20 remaining open defining an opened end 41 communicating with the interior space 32. As shown in FIG. 3D, the frame 10 or the core/coil assembly 36 is moved. In the embodiment, the open frame 10 is moved in the direction of arrow A so as to be slipped over the core/coil assembly 36 until a bottom 42 of the core 39 of the core/coil assembly 36 is engaged by a surface of the bottom wall 16. Thus, the core/coil assembly 36 is cradled by the frame 10 with the core 39 disposed horizontally.

Next, as shown in FIG. 3E, the top wall 20 is bent about notch 38" so as to be disposed over a portion of the top 44 of the core/coil assembly 36, with the mounting flanges 22 and 24 in mating relation so that the through-holes 26 and 27 align. As best shown in FIG. 4, the fasteners 31 are then inserted through the aligned through-holes 27 and secure with a washer 45 and a nut 46 (FIG. 4) to secure the core/coil assembly 36 in the frame 10. The fasteners 31 and nuts 46 may be considered to be part of the mounting structure 29 of the frame 10. FIG. 5 shows a top view of the frame 10 and core/coil assembly 36 with the frame 10 generally surrounding the core 39.

Thus, the piece of metal 12 is bent to define the frame 10 having the back wall 14, bottom wall 16 integral with the back wall, the front wall 18 integral with the bottom wall and in opposing relation to the back wall, and the top wall 20 integral with the front wall and in opposing relation to the bottom wall. The walls define a generally rectangular enclosure having the open sides 28, 30 communicating with the interior space 32, with the core/coil assembly 36 being in the interior space retained by the walls and the side flanges 34. The side flanges 34 that are disposed perpendicular with respect to the associated wall limit side-to side movement of the core 39, and the front wall 18 and back wall 14 limit front and back movement of the core 39. After the bending steps, the notches 38, 38', 38" and opposing angled ends 40, 40' define corners of the rectangular frame 10.

The frame 10 with core/coil assembly 36 can be easily lifted due to the robustness of the frame 10. The through-holes 26 are constructed and arranged to receive a fastener, such as a threaded stud on a tank wall (not shown) for mounting the frame 10 to the wall of the transformer tank. Alternatively, the frame 10 can be attached to the tank wall by welding a separate attachment bracket (not shown).

Since a single frame 10 is provided, a quicker assembly process to the core/coil assembly 36 is possible because only one part is being handled instead of three, when compared to the conventional U-frame/top frame configuration. The conventional, unique bracket for attaching to the tank wall is also eliminated. When compared to the conventional banded frame assembly, the one piece frame 10 saves time during assembly, eliminates inconsistencies in banding tension and removes any safety issues associated with lifting the assembly.

The foregoing preferred embodiments have been shown and described for the purposes of illustrating the structural and functional principles of the present invention, as well as illustrating the methods of employing the preferred embodiments and are subject to change without departing from such principles. Therefore, this invention includes all modifications encompassed within the spirit of the following claims.

What is claimed is:

1. A method of providing a frame and a core/coil assembly for a transformer, the method comprising the steps of:
   providing a linear, single piece of metal as a frame having first, second, and third notches disposed in spaced relation, the frame having opposing ends,
   bending a first portion of the frame about the first notch to define a first wall of the frame,
   bending a second portion of the frame about the second notch to define a second wall and a third wall of the frame and defining an opened end communicating with an interior space of the frame,
   moving the frame or the core/coil assembly so that the core/coil assembly is engaged by a surface of the second wall, with the core/coil assembly being disposed in the interior space, and
   bending a third portion of the frame about the third notch to define a fourth wall of the frame and to close the opened end, thereby defining a generally rectangular enclosure about a portion of the core/coil assembly having open sides, with the opposing ends of the frame being adjacent to each other.

2. The method of claim 1, further comprising:
   securing the opposing ends of the frame together to secure the core/coil assembly within the frame.

3. The method of claim 2, wherein the fourth wall and the first wall each includes a mounting flange extending therefrom that mate with each other, wherein the securing step includes securing the mating mounting flanges together.

4. The method of claim 3, wherein the step of securing the mating mounting flanges together includes using at least one fastener.

5. The method of claim 4, wherein mating through-holes are provided through the mating mounting flanges, the at least one fastener being a bolt provided through the mating through-holes and secured with a nut to secure the mating mounting flanges together.

6. The method of claim 2, further comprising:
   limiting movement of the core/coil assembly with respect to the frame at the opened ends thereof by providing side flanges extending transversely with respect each of the walls so that the side flanges can engage portions of the core/coil assembly.

7. The method of claim 6, wherein the core/coil assembly includes a coil wound around a metal core with the side flanges engaging portions of the core.

8. The method of claim 7, wherein the frame generally surrounds the core.

9. The method of claim 1, wherein the moving step includes moving the frame relative to the core/coil assembly.

* * * * *